United States Patent
Uchiyama et al.

(10) Patent No.: US 7,022,614 B2
(45) Date of Patent: Apr. 4, 2006

(54) METHOD OF ETCHING BACK OF SEMICONDUCTOR WAFER

(75) Inventors: Akira Uchiyama, Tokyo (JP); Yutaka Kamata, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 226 days.

(21) Appl. No.: 10/259,614

(22) Filed: Sep. 30, 2002

(65) Prior Publication Data

US 2003/0199164 A1 Oct. 23, 2003

(30) Foreign Application Priority Data

Apr. 18, 2002 (JP) .............................. 2002-116396

(51) Int. Cl.
*H01L 3/02* (2006.01)

(52) U.S. Cl. .................. 438/707; 438/719; 216/41

(58) Field of Classification Search ................ 438/689, 438/745, 707, 719; 216/41
See application file for complete search history.

(56) References Cited

U.S. PATENT DOCUMENTS 5,422,921 A * 6/1995 Chiba ......................... 378/34
5,843,844 A * 12/1998 Miyanaga ................... 438/694
5,903,092 A * 5/1999 Akama ....................... 313/311

FOREIGN PATENT DOCUMENTS

| JP | 03116716 A | * | 5/1991 |
| JP | 5-109688 | | 4/1993 |
| JP | 06-196396 | | 7/1994 |
| JP | 06252035 A | * | 9/1994 |
| JP | 11-168040 | | 6/1999 |

OTHER PUBLICATIONS

Okubo et al., Manufacture of X-Ray Mask (English Abstract of JP 0625035 A), Sep. 9, 1994, 2 pages.*
Nikawa, X-ray Mask and Manufacture Thereof, May 17, 1991, English Abstract of JP 03116716 A, 2 pages.*

* cited by examiner

Primary Examiner—Nadine G. Norton
Assistant Examiner—Lynette T. Umez-Eronini
(74) Attorney, Agent, or Firm—Rabin & Berdo, PC

(57) ABSTRACT

A resist pattern is formed at an outermost peripheral end of the surface of a wafer. Thereafter, the back of the wafer is back-etched using chemicals to thin the wafer. A passivation film is left behind only at scribe lines for separating semiconductor chips located at the outermost peripheral end of the wafer surface and thereafter the wafer is back-etched.

20 Claims, 5 Drawing Sheets

METHOD OF ETCHING BACK OF SEMICONDUCTOR WAFER

BACKGROUND OF THE INVENTION

1. Field of the Invention

The present invention relates to a method of etching the back of a semiconductor wafer, and particularly to a method of etching the back of a semiconductor wafer, which prevents an etchant from getting around into the semiconductor wafer upon etching the back of the semiconductor wafer to form a thin wafer.

2. Description of the Related Art

A semiconductor chip used for an IC card needs to extremely thin the thickness of the chip according to its use forms and enhance strength with respect to bending of the IC card because there is a possibility that the IC card will be bent for use. Therefore, there is a need to provide a specific process for processing a chip into a thin form in addition to a process used in a normal semiconductor device manufacturing method.

After semiconductor elements have been formed on a silicon wafer, there is a need to execute backetch for chemically etching the back of a normal wafer with chemicals subsequently in addition to mechanical grinding (background) of the wafer back, which has been effected on the normal wafer. Since the wafer is mechanically cut in the backgrind process, innumerable fine irregularities and distortion occur in the back of the wafer subsequent to the backgrind.

When the wafer is bent in this state, a stress developed due to its bending concentrates on concave and convex portions or distorted portions to thereby make the wafer fragile. The backetch serves so as to remove a surface layer of the wafer back formed with the concave and convex portions or distortion developed in the vicinity thereof and simultaneously smooth the concave and convex portions. As a result, the thickness of the wafer can be extremely thinned while a bending strength is being maintained.

After the semiconductor elements have been formed on the wafer surface side via the normal wafer process, the wafer back is back-ground. FIG. 1 is a schematic diagram of a wafer as viewed on a plan basis. A large number of semiconductor chips 102 are formed on a wafer 101. Semiconductor chips 104 formed only as some of the chips exist at a wafer end 103 around the wafer.

After the elapse of the proper time, backetch for chemically etching the back of the wafer is carried out. FIG. 2 typically shows an outline of a backetch process section. Chemicals 202 are sprayed from the back of a wafer 201 to etch a wafer back 203. A nitrogen gas 205 is supplied to a wafer surface 204 so that the chemicals 202 do get around into the surface of the wafer. After the completion of the backetch, the wafer formed with a large number of chips is divided into individual semiconductor chips by cutting chip-to-chip scribe lines.

However, the chemicals used in the backetch get around into the surface side of a wafer peripheral portion in the conventional backetch process, and hence the peripheral portion of the wafer surface is locally etched. Therefore, a problem arises in that when a force is applied to the etching portion upon handling of the wafer, stress concentration occurs, so that the wafer breaks up.

FIG. 3 is an enlarged view of the peripheral portion of the wafer in FIG. 1. As shown in FIG. 3, semiconductor chips 301 each formed in a complete form, and semiconductor chips 303 each formed in an incomplete form because of being located at a wafer end 302, exist on the wafer. The respective chips are separated from one another by scribe lines 304.

A semiconductor chip is normally formed with a passivation film at the top layer to protect an internal circuit from moisture in the air, contamination, etc. The passivation film makes use of an oxide film ($SiO_2$) or a nitride film (SiN) or the like having high insulating properties and a moisture penetration control capability. The passivation film is formed so as to cover a whole area surface except for electrode withdrawal portions such as pads.

However, such a structure as not to leave the passivation film behind is normally used in each of scribe-line portions to avoid moisture-resistance degradation due to fly-off of the passivation film and its crack intrusion upon cutting of the scribe-line portions at the division of the chips. This is because there is a possibility that the passivation film will fly off to thereby cover the electrode withdrawal portions in the chip cutting process, and a failure in connection will occur in its subsequent wiring connecting process.

Meanwhile a problem arises in that in the backetch process, the chemicals 202 fly off toward the wafer periphery, whereas at the end of the wafer, the intrusion of the chemicals 202 round into the wafer surface as designated at numerals 206 will occur. The chemicals 206 make use of one which etches a silicon wafer 201 and has such a characteristic as not to etch an oxide film and a nitride film. However, when the chemicals get around into the wafer surface from the end of the wafer, only ends of scribe lines are etched as designated at numerals 305 in FIG. 3 because silicon is exposed.

As a result, a problem arises in that the possibility that when the wafer is distorted due to wafer conveying, absorption and handling or the like in respective manufacturing/detecting processes subsequent to the backetch, and stresses concentrate on the scribe-line ends, the wafer will crack, becomes extremely high. Thus, manufacturing yields are significantly degraded.

SUMMARY OF THE INVENTION

The present invention provides a backetch method which does not cause etching due to the entering of chemicals around into a wafer surface peripheral portion upon backetch, which is of the above-described problem. In a first invention, a pattern of an etching-resistant film having resistance to chemicals used in backetch is formed at an outermost peripheral end of a wafer surface, and thereafter the back of a wafer is etch-backed.

In a second invention, an etching-resistant film having resistance to chemicals used in backetch is formed at part of scribe lines located on the outermost periphery of a wafer, and thereafter the back of the wafer is etch-backed.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Preferred embodiments of the present invention will hereinafter be described with reference to the accompanying drawings.

Figure 1:
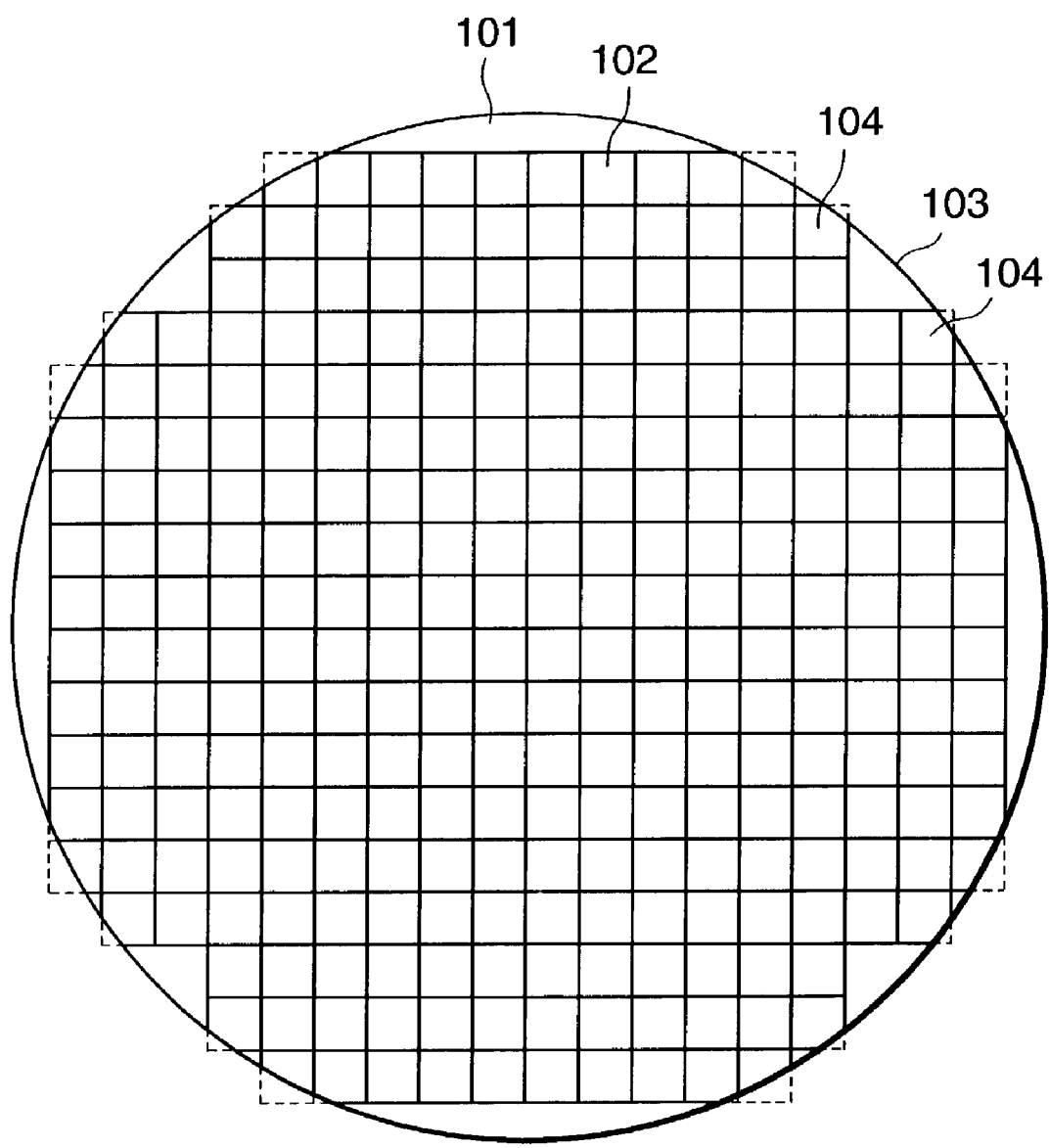
FIG. 1 is a plan view of a wafer formed with a semiconductor chip for describing a prior art.
Figure 2:
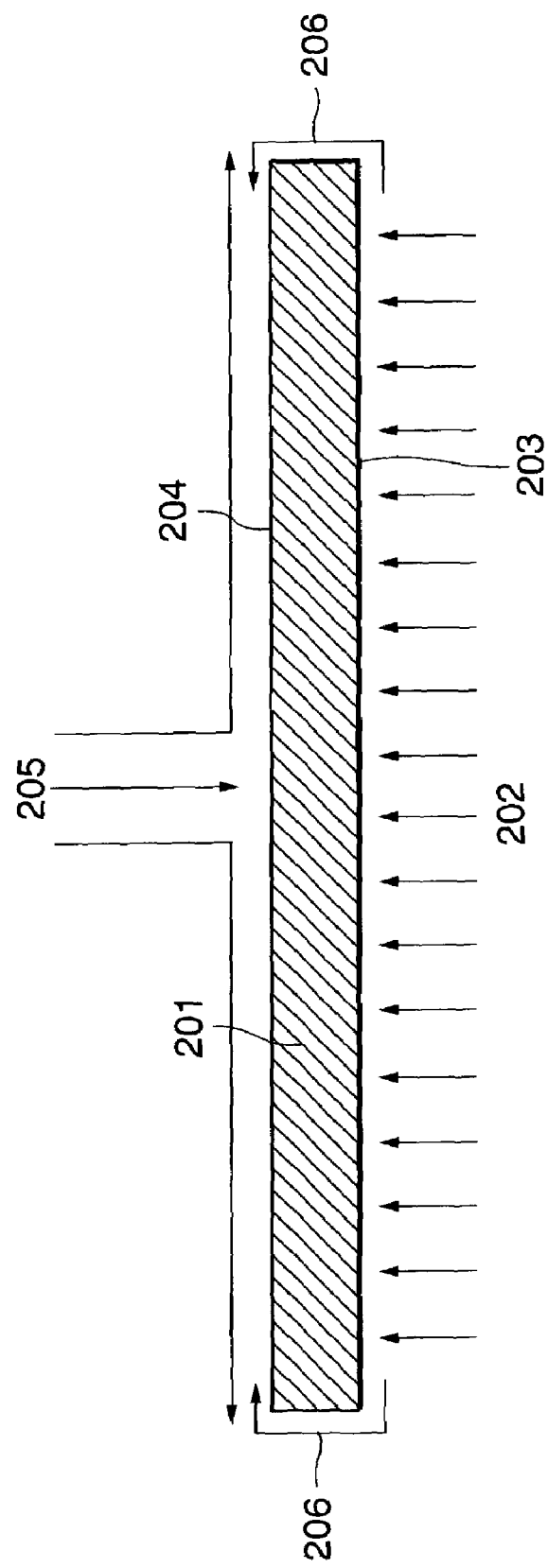
FIG. 2 is a schematic diagram showing a wafer section when the back of a wafer employed in a prior art is etchbacked.
Figure 3:
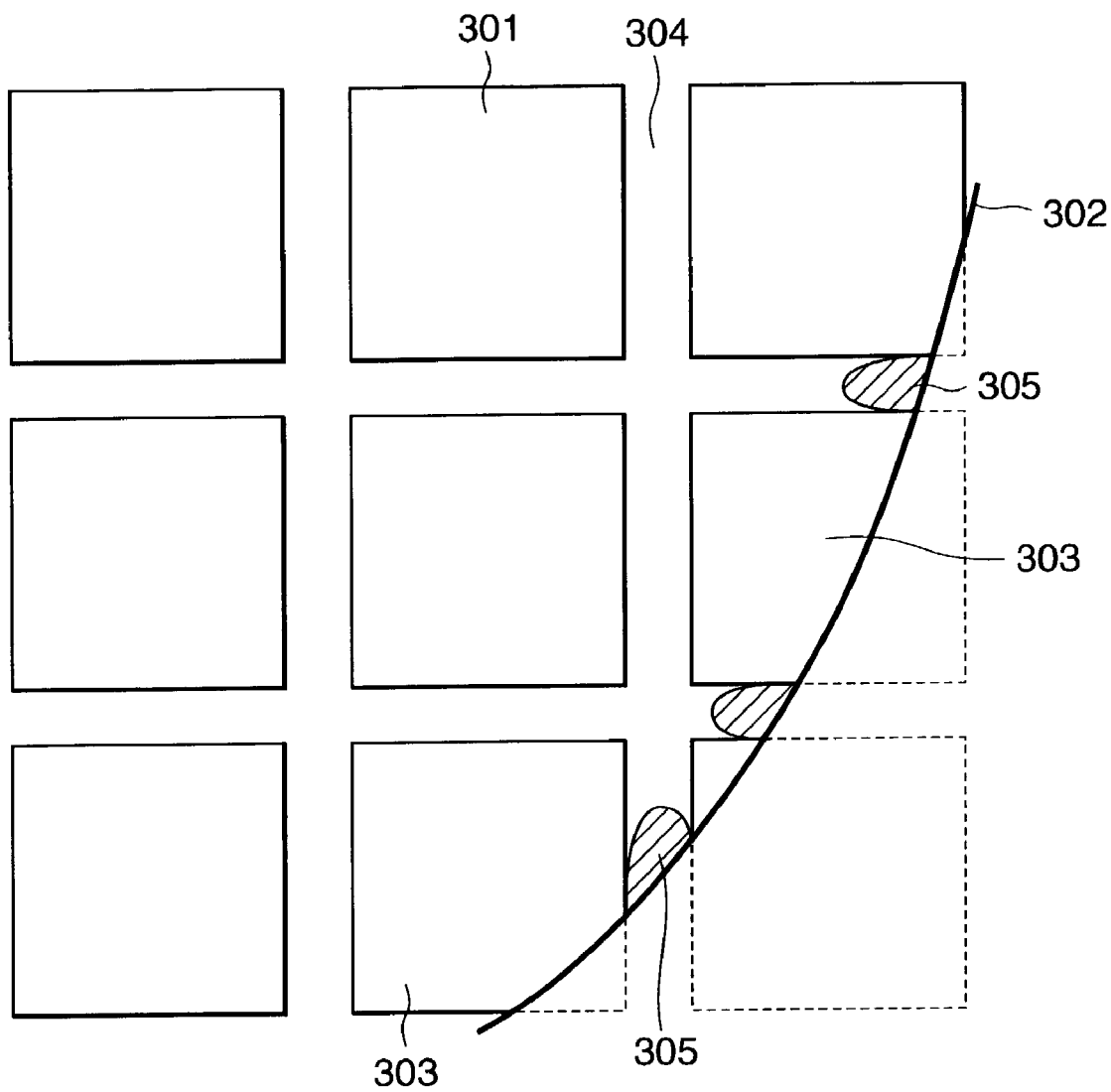
FIG. 3 is an enlarged view of the wafer formed with the semiconductor chip at a wafer peripheral portion of FIG. 1.
Figure 4:
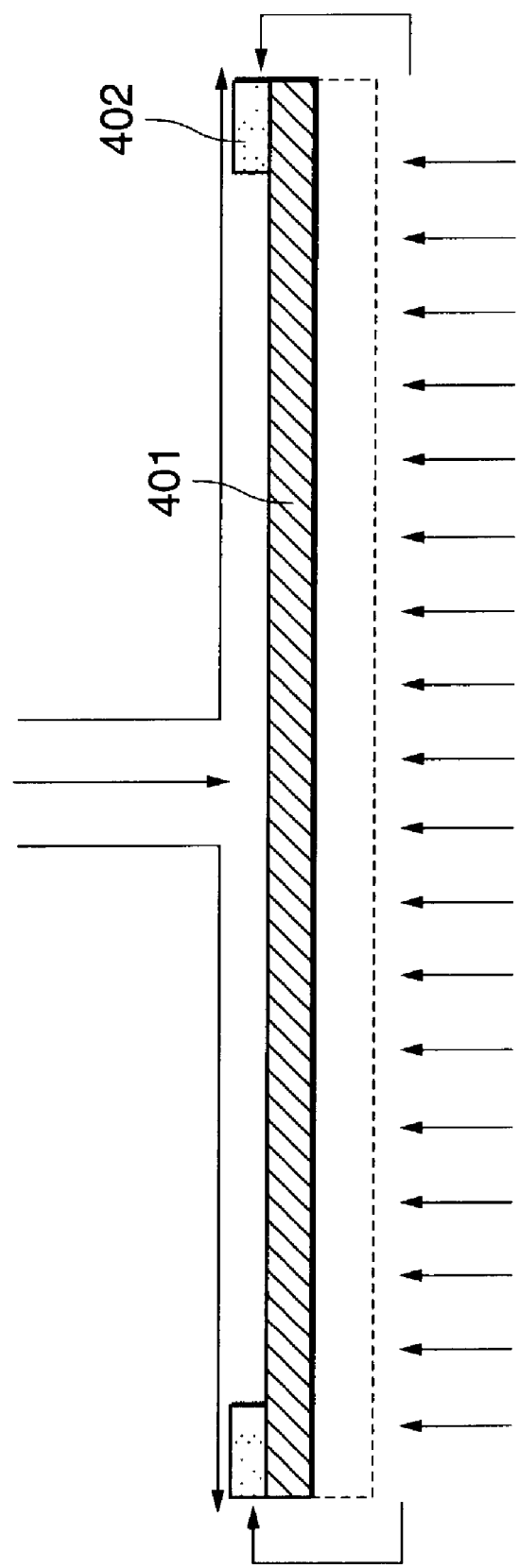
FIG. 4 is a schematic diagram showing a wafer section when the back of a wafer employed in a first embodiment is etchbacked.

A cross-sectional view of a wafer for describing a first embodiment of the present invention is shown in FIG. 4. The embodiment of the present invention provides a manufacturing method wherein a ring-shaped etching-resistant pattern is formed around a wafer surface before a wafer backetch process step.

After up to a passivation film has been formed on a semiconductor chip, a resist is applied onto a wafer 401. After the elapse of a proper time, the periphery of the wafer is exposed so as to extend to within a predetermined area around the wafer to thereby leave and form a resist pattern 402 only around the wafer. Afterwards, backetch-step processing is executed in a state in which the resist pattern has been formed.

According to the present embodiment, since the surface of the peripheral portion of the wafer is covered with the resist pattern, the surface thereof is not impregnated with chemicals through scribe lines in a back-etching process step. As a result, etching of scribe-line portions around the wafer can be suppressed. While the embodiment of the present invention has described the case in which the etching-resistant film is used as the resist, another oxide film or the like may be used. Since the etching-resistant film is formed on the outermost periphery, there is no need to eliminate it in a process step subsequent to the backetch.

Figure 5:
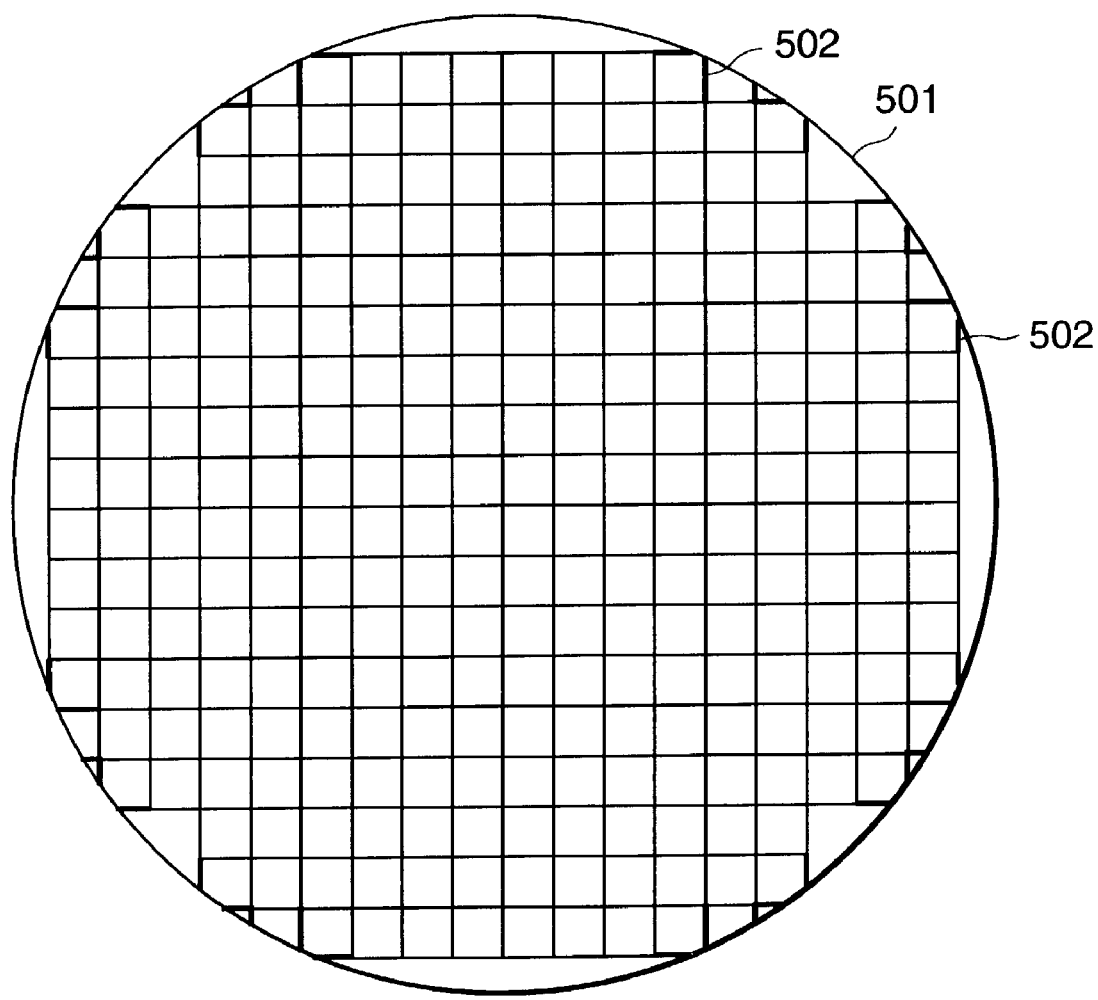
FIG. 5 is a plan view illustrating a wafer formed with a semiconductor chip for describing a second embodiment.

A second embodiment of the present invention will next be described. The present embodiment is one wherein as shown in FIG. 5, a passivation film has been left behind only at scribe-line portions 502 located at an end 501 around a wafer. Semiconductor chips, each of which contacts the scribe-line portions at which the passivation film is left behind, are incomplete and defective chips. Even if the passivation film flies in all direction upon chip cutting, no problem occurs.

According to the present embodiment, since the passivation film is left behind at the scribe-line portions 502 that extend over the periphery of the wafer, the wafer is not impregnated with the chemicals through the scribe-line portions 502 in the backetch process step. As a result, the etching of the scribe-line portions 502 around the wafer can be suppressed. Since the present embodiment can be implemented by simply changing the mask employed in the conventional passivation film etching process step, an increase in the number of process steps can be avoided.

The second embodiment can obtain a similar effect even if an oxide film-based film other than the passivation film is used as the remaining film. For example, a single-layered film formed of an oxide film, a nitride film or an oxynitride film, or an intermediate insulating film formed of the nitride film, the oxynitride film or a laminated film of the oxynitride film, or an interlayer insulating film or the like may be left in the scribe-line areas around the wafer.

According to the present invention as described above, chemicals can be prevented from getting round into the surface of a wafer upon backetch of the back thereof. Therefore, a method of manufacturing a semiconductor device can be realized which can prevent careless cleaving of the wafer and provide high yields.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of etching a semiconductor wafer, comprising:
    preparing the semiconductor wafer having a first surface on which a plurality of semiconductor elements are formed, and a second surface that is opposite to the first surface, the semiconductor elements being separated by a plurality of scribe lines formed on the first surface of the semiconductor wafer;
    forming on the first surface of the semiconductor wafer an etching-resistant film having resistance to an etchant for etching the semiconductor wafer;
    patterning the etching-resistant film so as to leave the etching-resistant film at an outermost periphery of the first surface of semiconductor wafer; and
    etching the second surface of the semiconductor wafer with the etchant.

2. The method according to claim 1, wherein the etching-resistant film is a resist.

3. The method according to claim 1, wherein the semiconductor wafer is a silicon wafer.

4. The method according to claim 1, wherein the etching-resistant film is shaped in a ring form.

5. A method of etching a semiconductor wafer, comprising:
    preparing the semiconductor wafer having a first surface on which a plurality of scribe lines are formed, and a second surface that is opposite to the first surface;
    forming on the first surface of the semiconductor wafer an etching-resistant film having resistance to an etchant for etching the semiconductor wafer;
    leaving the etching-resistant film only at the scribe lines located on an outermost periphery of the first surface of the semiconductor wafer; and
    etching the second surface of the semiconductor wafer with the etchant.

6. The method according to claim 5, wherein the semiconductor wafer is a silicon wafer.

7. The method according to claim 6, wherein the etching-resistant film is a passivation film.

8. The method according to claim 7, wherein the passivation film is a film selected from the group consisting of a single-layered film and a laminated film formed of a material selected from a group consisting of oxide, nitride and oxynitride.

9. The method according to claim 6, wherein the etching-resistant film is a film selected from the group consisting of an intermediate insulating film and an interlayer insulating film.

10. The method according to claim 9, wherein the intermediate insulating film is a single-layered film selected from the group consisting of an oxide film, a nitride film and an oxynitride film.

11. The method according to claim 9, wherein the intermediate insulating film is a laminated film including at least two films selected from the group consisting of an oxide film, a nitride film and an oxynitride film.

12. The method according to claim 9, wherein the interlayer insulating film is a single-layered film selected from the group consisting of an oxide film, a nitride film and an oxynitride film.

13. The method according to claim 9, wherein the interlayer insulating film is a laminated film including at least two films selected from the group consisting of an oxide film, a nitride film and an oxynitride film.

14. A method of etching a semiconductor wafer comprising:
   preparing the semiconductor wafer having a first surface on which a plurality of scribe lines are formed, and a second surface that is opposite to the first surface;
   forming an etchant-resistant film on the first surface of the semiconductor wafer;
   leaving the etchant-resistant film on the scribe lines at a peripheral region of the semiconductor wafer so that the scribe lines at the peripheral region are filled with the etchant-resistant film; and
   etching the second surface of the semiconductor wafer with an etchant.

15. The method of etching a semiconductor wafer according to claim 14, wherein the etchant-resistant film is a single-layered film formed of a material selected from the group consisting of oxide, nitride and oxynitride.

16. The method of etching a semiconductor wafer according to claim 14, wherein the etchant-resistant film is a laminated film including at least two films selected from the group consisting of an oxide film, a nitride film and an oxynitride film.

17. The method of etching a semiconductor wafer according to claim 14, wherein the etchant-resistant film is a passivation film.

18. The method of etching a semiconductor wafer according to claim 14, wherein the leaving includes removing a central portion of the etchant-resistant film.

19. The method of etching a semiconductor wafer according to claim 14, wherein the etchant-resistant film prevents an invasion of the etchant.

20. The method according to claim 1, wherein said patterning leaves the etching-resistant film at only the outermost periphery of the first surface of the semiconductor wafer, and wherein said etching is performed after said patterning.

* * * * *